United States Patent
Walker et al.

(10) Patent No.: US 7,746,179 B1
(45) Date of Patent: Jun. 29, 2010

(54) METHOD AND APPARATUS FOR SELECTING A FREQUENCY GENERATING ELEMENT

(75) Inventors: David Walker, Fremont, CA (US); Nathaniel King, Jr., Morgan Hill, CA (US); Robert Koupal, San Leandro, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 135 days.

(21) Appl. No.: 11/900,691

(22) Filed: Sep. 12, 2007

Related U.S. Application Data

(60) Provisional application No. 60/844,512, filed on Sep. 13, 2006.

(51) Int. Cl.
*H03L 7/00* (2006.01)

(52) U.S. Cl. .............................. 331/10; 331/16; 331/44; 331/46; 331/179

(58) Field of Classification Search .................... 331/10, 331/16, 44, 46, 179
See application file for complete search history.

(56) References Cited

U.S. PATENT DOCUMENTS

| | | | |
|---|---|---|---|
| 4,510,461 A | 4/1985 | Dickes et al. | |
| 5,686,864 A | 11/1997 | Martin et al. | |
| 6,512,801 B1 | 1/2003 | Ninomiya | |
| 6,707,342 B1 | 3/2004 | Zachan et al. | |
| 6,933,789 B2 | 8/2005 | Molnar et al. | |
| 7,155,188 B2* | 12/2006 | Noboru et al. | 455/255 |
| 7,301,415 B2* | 11/2007 | Wang et al. | 331/179 |
| 2002/0075080 A1* | 6/2002 | Nelson et al. | 331/11 |
| 2003/0224749 A1* | 12/2003 | Uozumi et al. | 455/252.1 |
| 2004/0000956 A1* | 1/2004 | Jaehne et al. | 331/16 |
| 2005/0253658 A1* | 11/2005 | Maeda et al. | 331/2 |

OTHER PUBLICATIONS

Lee, Han-Il et al., "A Sigma-Delta Fractional-N Frequency Synthesizer Using a Wide-Band Integrated VCO and a Fast AFC Technique for GSM/GPRS/WCDMA Applications," IEEE Journal of Solid-State Circuits, Jul. 2004, pp. 1164-1169, vol. 39, No. 7, IEEE.

* cited by examiner

*Primary Examiner*—Joseph Chang
*Assistant Examiner*—Jeffrey Shin
(74) *Attorney, Agent, or Firm*—Withrow & Terranova, PLLC

(57) ABSTRACT

A method and apparatus for selecting an optimum VCO from an array of VCOs is disclosed. Each VCO in the array has an output range and a limit. In one embodiment, a search set of VCOs is designated as all VCOs in a system. The limit is compared to a tuning value which corresponds to a desired calibration frequency. The comparison divides the array of VCOs into a searched set and a non-searched set. The process is repeated until the non-searched set comprises only one VCO. In another embodiment, the VCOs are ordered such that there is a middle VCO. A VCO in the middle of the array is selected. The limit of the middle VCO is compared to a tuning limit. Based on the comparison, another VCO is selected. The process repeats N times, where N is the logarithm, base 2, of the total number of VCOs to be searched. at the end of the search, an optimum VCO will be found.

32 Claims, 5 Drawing Sheets

METHOD AND APPARATUS FOR SELECTING A FREQUENCY GENERATING ELEMENT

CROSS-REFERENCE TO RELATED APPLICATIONS

This application claims priority of provisional application Ser. No. 60/844,512, filed Sep. 13, 2006, entitled DIAGNOSABLE STRUCTURED LOGIC ARRAY, which is incorporated herein by reference.

FIELD OF INVENTION

This invention is in the field of integrated circuits. More specifically, this invention is in the field of voltage controlled oscillators.

BACKGROUND

The phase locked loop (PLL) is a common method of frequency synthesis in modern communications. Among other uses, conventional PLLs are integral components in wireless communication transceivers and are also used for FM and AM modulation and demodulation, data and tape synchronization, frequency shift keying, tone decoding, frequency multiplication and division, signal regeneration, and control mechanisms in robotics, radio and satellite. A PLL normally includes a phase-frequency detector (PFD), a PLL charge pump and a voltage controlled oscillator (VCO). It is understood that another resonator element or any frequency generating element can replace a VCO in such a PLL. A PLL can also include a divider, loop filter, or a number of other devices depending on the intended output frequency of the PLL.

The PLL is normally configured to receive a reference frequency signal and transmit a desired output frequency signal. Specifically, in a conventional PLL, the reference frequency is coupled to a PFD. The PFD is coupled to a VCO. PFD is configured to receive the reference frequency and also the output frequency generated by the VCO. The PFD is also coupled to the PLL charge pump. The PFD detector transmits, and the PLL charge pump is configured to receive, an error signal with a value based on a phase and/or frequency difference between the reference frequency and the output frequency. The error signal causes the PLL charge pump to change its control voltage which adjusts the oscillation frequency of the VCO until the phase of the output frequency matches the phase of the reference frequency. This feedback loop causes the output frequency to phase lock on the reference frequency.

If a higher or lower output frequency is desired, a frequency divider or multiplier can be introduced between the output frequency of the VCO and the phase detector to manipulate the frequency to be smaller or larger. To simplify this discussion, only a divider will be considered though a multiplier can be substituted for the divider. A divider can be configured to receive the output frequency and transmit a manipulated frequency to the phase detector based on the value of the divider. The PFD generates a voltage control signal to the VCO in response to differences between the reference frequency and the manipulated frequency. The voltage control signal is provided until the phase of the reference frequency matches the phase of the manipulated frequency. The PLL thereby locks its phase to a fraction or multiple of the reference frequency. Thus, a variety of frequencies can be produced from a single reference frequency by changing the value of the divider.

In integrated circuit transceivers, the VCO must be designed to operate over the desired frequency range plus an extra allowance for process and temperature variations. This extra allowance may expand the frequency range up to three to four times the actual desired frequency range. This action requires an increase the in VCO gain ($K_{VCO}$). This is contrary to high-performance transceiver design because it results in a frequency synthesizer with unacceptably large phase noise. A possible solution to the problem is to implement the PLL using several lower gain VCOs that together span the total frequency range including allowances for process and temperature variations. Multiple VCOs could be realized as physically separate circuits, a single oscillator with switchable resonator elements, or a combination of both. However, this solution creates a new problem of selecting the proper VCO and/or a configuration of switchable resonator elements to produce the desired frequency.

This has been approached several different ways. One early method describes a PLL with multiple loop filters and VCOs designed to synthesize frequencies over a broad range, perhaps several decades of frequencies. The proper VCO is selected by using a window comparator on the currently selected VCO's tuning voltage. Because a PFD is used, if the tuning voltage is in the window, the PLL locks.

A later solution prescribes the circuit to select the proper VCO using a lock detection circuit and sequentially trying each VCO until one of them locks. The lock detector could be implemented by a window comparator or as a digital circuit.

However, neither of these solutions find the optimal VCO, but simply the first one that locks. For example, two VCOs can lock and either can be chosen randomly or by predetermined means. Another scheme attempts find the optimum VCO by producing a table of the lock/unlock status for each of the VCOs. If multiple VCOs lock, the VCO in the middle is selected. Although the algorithm could terminate in as little as two iterations, as many as M iterations can be required for the algorithm to succeed, where M is the total number of VCOs. Having a variable number of iterations, and therefore a variable time required to select the optimum VCO is a disadvantage because the design of the system in which the PLL is used must be made assuming the worst case, or most time consuming condition.

Another solution describes how to select the optimum VCO when using multiple VCOs within the desired range of frequencies. A binary search is used to determine the optimal crossover frequency between each pair of VCOs. This solution leaves an unsolved problem of selecting a frequency range in which the optimum VCO is, which requires more circuitry.

Another example uses a frequency synthesizer including a calibration circuit, where that calibration circuit requires fixing the VCO input to a specific voltage and a separate frequency comparator computes the difference between the reference frequency and a prescaled VCO output frequency. A binary search is then used to select the proper VCO. However, additional circuitry is required for the frequency comparison. Furthermore, because the VCO input voltage must be switched, extra circuitry must be placed on the tuning voltage signal which results in increased phase noise. At the multiple gigahertz frequencies at which modern wireless appliances operate at, this noise is unacceptable. Each of these prior attempts has one or more difficulties. A simplified and improved approach is needed.

SUMMARY OF DISCLOSURE

Embodiments of this invention include a method of and a circuit to select an optimum VCO to generate a target frequency among an array of VCOs or switchable resonator elements. Each VCO in the array has an output frequency range, with a lower tuning limit and an upper tuning limit. In some embodiments, the array of VCOs is ordered highest to lowest by their output frequency ranges, such that the VCO with the lowest frequency range is first in the order. A binary search is used to select the optimum VCO. The search begins by placing a search window on the VCO in the middle of the order. In some embodiments, the upper tuning limit of that VCO is compared to a reference tuning voltage. The reference tuning voltage is set to an extreme value of the VCO tuning voltage that results in the lowest possible $K_{VCO}$. This extreme value could be limited through other considerations such as the supply voltage range and the compliance range of the PLL charge pump current source. The calibration frequency is set to an extreme frequency as determined by the system requirements such that the $K_{VCO}$ is minimized. For example, some VCOs have larger $K_{VCO}$s for higher frequencies so in that case, the maximum system frequency is used to select the optimal VCO. The calibration is imposed on the circuit by configuring the dividers to produce the calibration frequency. If the reference tuning voltage is greater than the upper tuning limit, the search window is moved down the order by a search variable. If the reference tuning voltage is not greater than the upper tuning limit, the search window is moved up the order by a search variable. In alternate embodiments, the VCOs can be ordered such that the VCO with the highest frequency range is highest in the order. In such an embodiment, the search window moves up the order if the reference tuning voltage is greater than the upper tuning limit, and down the order if the reference tuning voltage is not greater than the upper tuning limit. The result of the comparison is to bring the search window closer to VCO that is generating the target frequency. No matter the result of the comparison, a next VCO will be determined, which will be the new location of the search window. In some embodiments, the search variable equals $2^{(N-1)}/2$, where N is the logarithm, base 2, of the total number of VCOs in the array. After the comparison, if the search variable does not equal 1, it will be divided by two. The steps of comparing the tuning limit of the VCO that is the search window to the reference tuning voltage, moving the search window up or down the order based on the result, and dividing the search variable are repeated N times. This method ensures that the optimum VCO will be selected in exactly N repetitions, where N is the logarithm, base 2, of the total number of VCOs in the array. This method also ensures that the required time to select the optimum VCO will always be known, and the rest of the circuitry can be designed accordingly. Also, the implementation of this method can be performed by any known or convenient means without the use of extra circuitry that will add complication and noise to the system.

DETAILED DESCRIPTION OF THE DRAWINGS

Embodiments of the present invention are directed to method of and apparatus for selecting a frequency among an array of frequencies. Those of ordinary skill in the art will realize that the following detailed description of the present invention is illustrative only and is not intended to be in any way limiting. Specific references are made to VCOs. It can be appreciated that components of equivalent or substantially similar function to a VCO can be used. Such components include, but are not limited to tunable resonators, banks of tunable resonators, banks of VCOs, or the like. Other embodiments of the present invention will readily suggest themselves to such skilled persons having the benefit of this disclosure. By way of example, it is generally known by those of ordinary skill in the art of integrated circuit design that a means for performing a binary search can be implemented in several ways, such as hardwired logic, programmable logic, microcontrollers, microprocessors, and the like.

Reference will now be made in detail to implementations of the present invention as illustrated in the accompanying drawings. The same reference indicators will be used throughout the drawings and the following detailed description to refer to the same elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
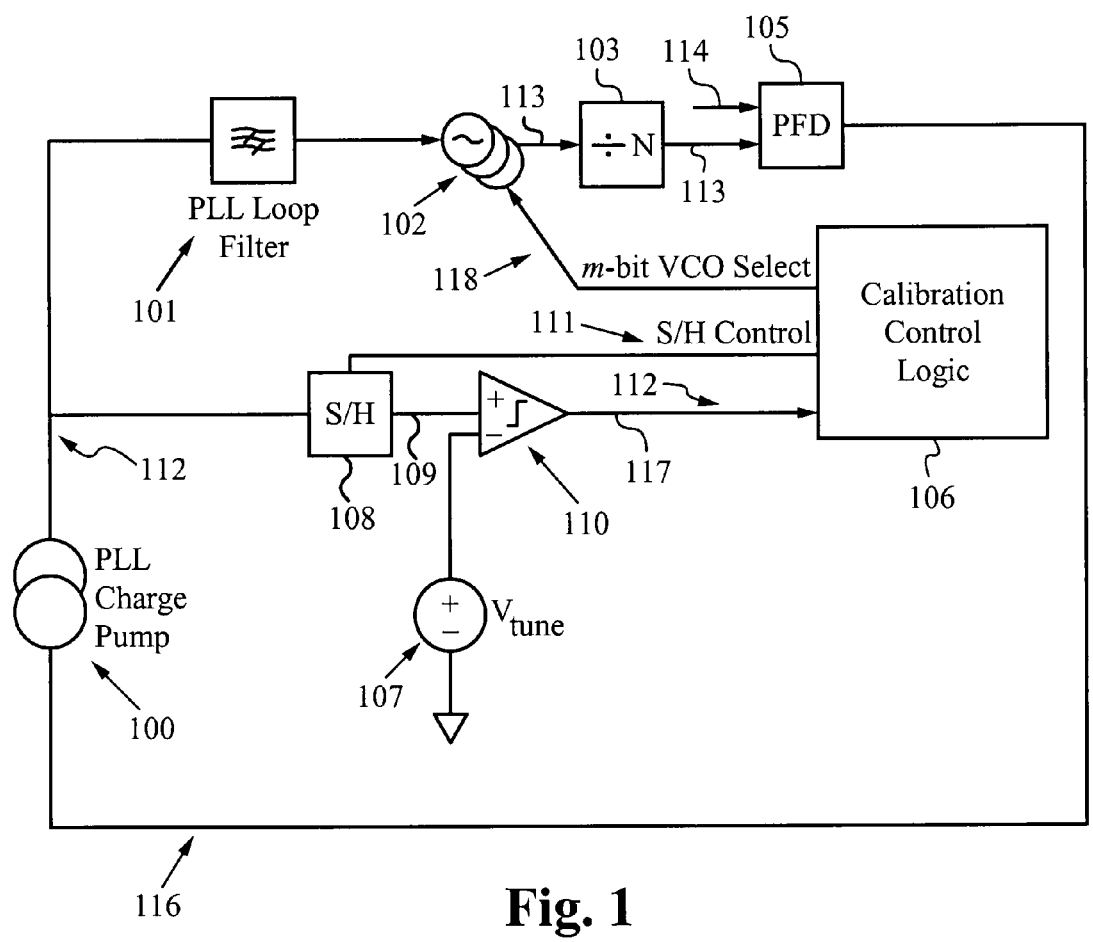
FIG. 1 shows a block diagram of the preferred of the embodiment of the invention showing all functional blocks.

An electric circuit for selecting an optimum VCO among an array of VCOs is disclosed. In FIG. 1, a schematic representation of the electric circuit is shown. A PLL charge pump 100 generates a filtered control voltage 112 through the PLL loop filter 101. The PLL loop filter is coupled to an array of VCOs 102. The array of VCOs 112 has M VCOs, where M is any integer. Each VCO is configured to have a unique output frequency range having an upper tuning limit and a lower tuning limit. In some embodiments, the array of VCOs are arranged in order by their upper tuning limit, ordered highest to lowest, such that the VCO with the highest frequency range is lowest in the order and the VCO with the lowest frequency range is highest in the order. In alternate embodiments, the VCOs can be ordered by their output frequency range or any other convenient way. In alternate embodiments, the plurality of VCOs 102 can be a single VCO with an array of resonator elements where each resonator element is configured to have a unique output frequency range having an upper tuning limit and a lower tuning limit. A selected VCO in the array of VCOs 102 transmits, and a divider 103 is configured to receive, an output frequency 113. The divider 103 is able to be configured to divide the output frequency 113 by a range of numbers appropriate to the design. In some embodiments, the divisor can be varied using a delta sigma modulator to realize fractional divisors. The divider 103 transmits, and the PFD 105 is configured to receive, a modulated frequency 113. The PFD 105 compares the frequency and phase of the divider output 113 to a reference frequency 114. The PFD 105 transmits, and the PLL charge pump 100 is configured to receive, an error signal 116. The PLL charge pump changes its control voltage 112 accordingly in response to the error signal 116. When the PLL system is "Locked," the reference 114 and the divisor output 113 have identical frequencies and zero phase difference. For this reason, the divisor 103 is set to a value corresponding to an extreme operating frequency. If the PLL is incapable of locking to the desired frequency because the selected VCO frequency range is insufficient, the PFD 105 causes the reference tuning voltage to obtain a value greater than the upper tuning limit or less than the lower tuning limit in such a way that the output frequency is closest to the desired frequency. At the beginning of the calibration procedure, the divider 103 is configured so the PLL will produce a frequency corresponding the highest or lowest required by the system. The extreme frequency chosen corresponds to the frequency that offers the lowest $K_{VCO}$.

The PLL charge pump is also coupled to a sample and hold circuit (S/H) 108. The S/H 108 samples the sampled control voltage 112 for a specified amount of time to filter the control voltage 112 of any unwanted noise. Alternatively, unwanted noise on the control voltage 112 can be filtered in any known or convenient manner. The S/H 108 is coupled to an analog comparator 110. The analog comparator 110 compares the sampled control voltage 109 with a reference tuning voltage 107. Alternatively, the comparator 110 is able to compare the control voltage 112. The reference tuning voltage 107 corresponds to an extreme desired value of the control voltage 112. In some embodiments, the reference tuning voltage 107 is the highest control voltage to be encountered by the system. The reference control voltage 107 is set according to the compliance range of the PLL charge pump 100 and the minimum value of $K_{VCO}$. The analog comparator 110 transmits, and a calibration control logic 106 is configured to receive, a compared value 117. Preferably, the calibration control logic 106 comprises the means to start a binary search by assigning a search window at the middle of the order of the array of VCOs 102. The calibration control logic 106 further comprises means to either move the search window down in the order if the reference tuning voltage 107 is greater than the control voltage 112, or move the search window up in the order if the reference tuning voltage 107 is not greater than the control voltage. In alternate embodiments, each VCO in the array of VCO's 102 can be ordered such that the VCO with the highest frequency range is highest in the order. In such a situation, the search window moves up the order if the reference tuning voltage is greater than the upper tuning limit, and down the order if the reference tuning voltage is not greater than the upper tuning limit. The calibration control logic 106 signals the search window to move up or down via a VCO select signal 118. The size of the increment or decrement in position is determined by a search variable, which initially equals $2^{(N-1)}/2$, where N is the logarithm, base 2, of M. This function will serve to select a next VCO among the array of VCOs 102, and therefore a new control voltage 112. The calibration control logic 106 further comprises means to repeat the search N times. The calibration control logic 106 further comprises means to compare the search variable to the number one, and if they are not equal, to divide the search variable by two. When the search has been repeated N times, the calibration control logic 106 will have selected the optimum VCO among the array of VCOs 102.

Figure 2A:
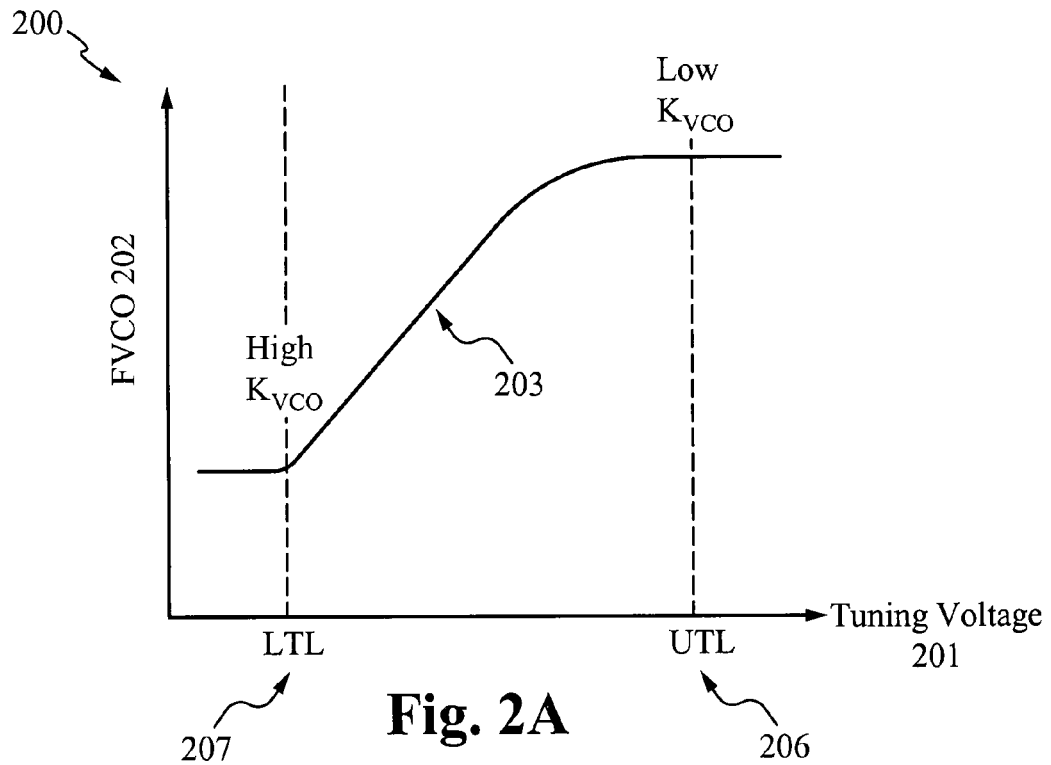
FIG. 2A is a graph showing the VCO gain slope of a VCO with positive gain.
Figure 2B:
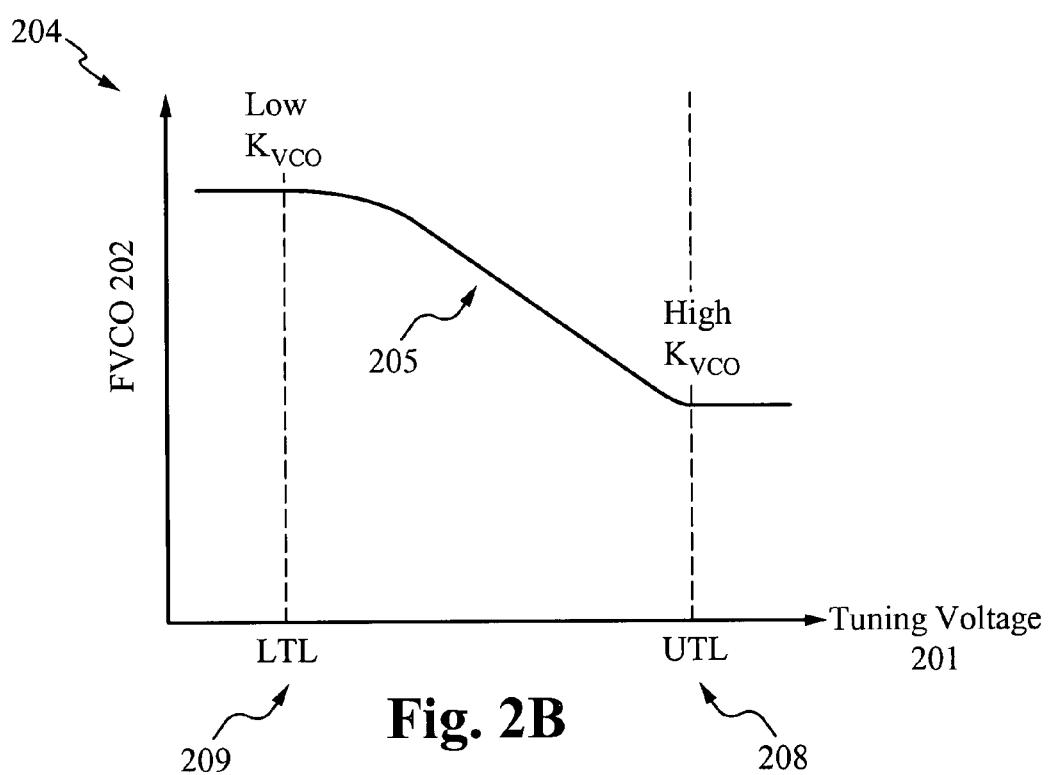
FIG. 2B is a graph showing the VCO gain slope of a VCO with negative gain.

It is understood that most VCOs have a VCO gain, $K_{VCO}$, that decreases with increased frequency due to non linear effects in the resonator tuning elements. In FIG. 2A, a graph 200 is shown, which compares reference tuning voltage 201 to output frequency 202 of a VCO. $K_{VCO}$ is the slope of the curve 203. In some VCOs, the slope is more flat in the higher frequency ranges of the VCO, and therefore $K_{VCO}$ is lower. It is desirable that the VCO be used in this range of operation because higher $K_{VCO}$ leads to higher phase noise, which is unacceptable for most wireless electronics. This is the reason that the reference tuning voltage 107 (FIG. 1) is chosen to correspond to the largest possible value. This value is further limited due to effects such as charge pump linearity so the reference tuning voltage 107 is set to the voltage UTL 206. Because the lowest $K_{VCO}$ occurs for the highest frequency, the divider 103 is configured to produce the highest frequency needed by the system. However, VCOs can be implemented such that the $K_{VCO}$ is negative and lowest at the lower frequency range of its operation, as shown in FIG. 2B. Graph 204 shows that the curve 205 is more flat toward the lower tuning limit, and therefore the lowest phase noise is achieved by operating in that region. Of course it is understood that the lowest $K_{VCO}$ may occur for lower frequencies. For these cases, the divider 103 is configured to produce the lowest frequency required by the system, and the reference tuning voltage 107 is set to LTL 209 and the divider 103 is configured as in the previous case. In all cases, the choice of the reference tuning voltage 107 and configuration of the divider 103 is chosen in such a way to minimize the operating $K_{VCO}$.

Figure 3:
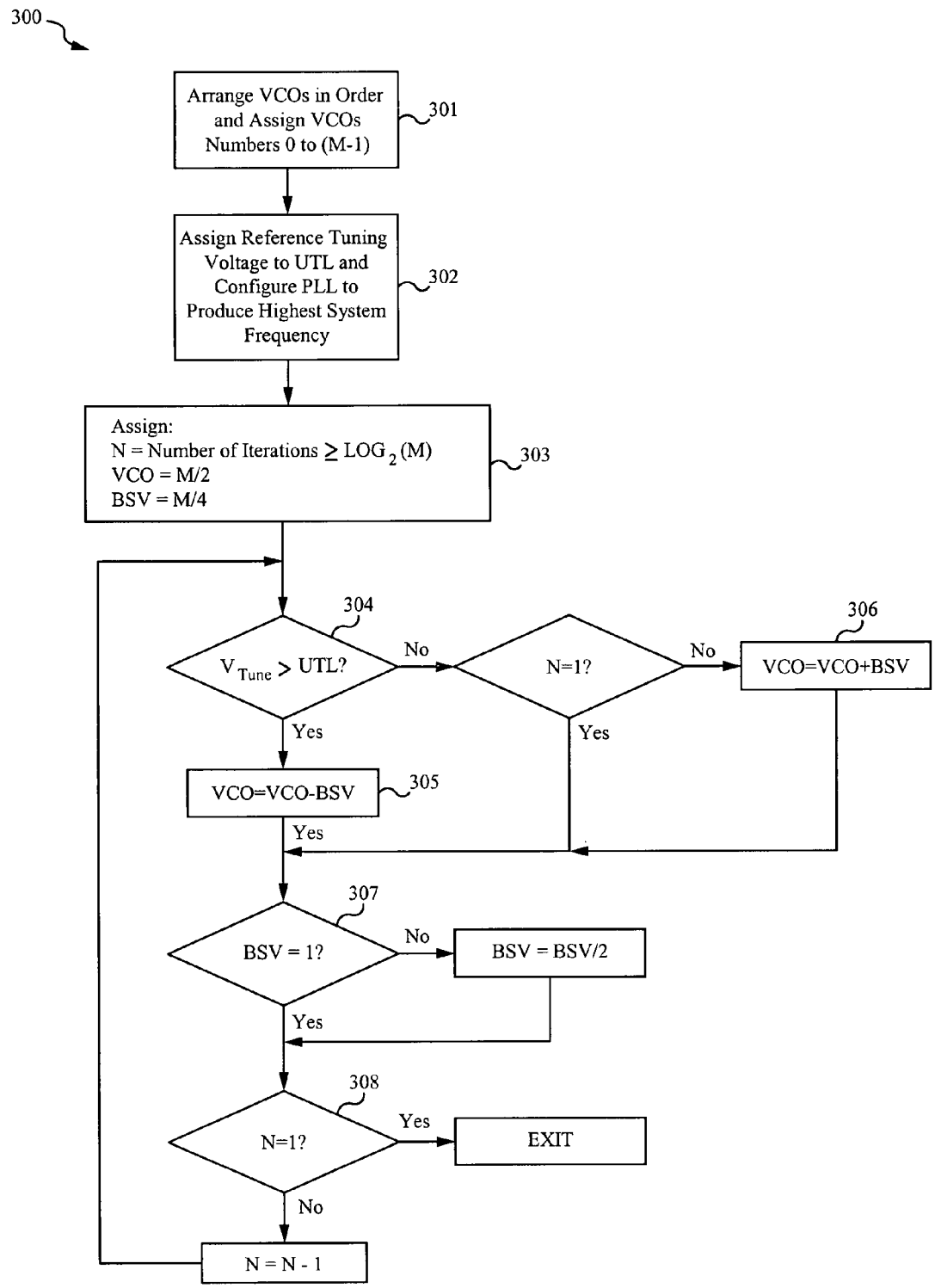
FIG. 3 shows a flow chart for a typical embodiment of the method and all functional steps for a VCO with positive VCO gain.

FIG. 3 shows an exemplary embodiment of a method 300 for selecting an optimum VCO for generating a target frequency among an array of M VCOs for the VCO tuning characteristics shown in FIG. 2A. Each VCO has a range of output frequencies each range having an upper tuning frequency and a lower tuning frequency. The first step 301 of method 300 is to arrange the VCOs into an order by their upper tuning frequencies, ordered highest to lowest, such that VCO with the highest frequency is lowest in the order and there is a middle VCO. In some embodiments, the VCOs are numbered 0 to M-1. Next, in step 302, a reference tuning voltage 107 is set to UTL 206 and the calibration frequency is set to the highest frequency to be encountered by the system. In the next step 303, a binary search is started by selecting the middle VCO, the VCO numbered M/2, assigning a binary search variable (BSV) to M/4, and selecting the number of iterations N which must be greater than or equal to $\log_2(M)$. The minimum number of iterations is $LOG_2(M)$, but more iterations can be performed. In some embodiments, the middle VCO is the VCO numbered M/2. In step 304, the reference tuning voltage 112 or the sampled tuning voltage 109 is compared to the reference tuning voltage 107 of the VCO that has been selected. If the tuning voltage 112 is greater than UTL 206, the process moves to step 305 and a next VCO is selected. Preferably, the next VCO selected is down in the order of VCOs by an increment equivalent to a binary search variable (BSV). Conversely, if the tuning voltage 112 is not greater than the UTL 206, and the iteration is not the final iteration, the next step is 306 and the next VCO selected is up in the order of VCOs by the binary search variable. If the iteration is the final iteration, then VCO is left unchanged because the VCO numbered VCO+BSV has already been visited and known to result in a control voltage 112 greater than the reference tuning voltage 107. In alternate embodiments, the VCOs can be ordered such that the VCO with the highest frequency range is highest in the order in step 301. In such an embodiment, the functions of steps 305 and 306 are reversed. No matter the result of the comparison in step 304, a next VCO is selected. Next, in step 307, the BSV will be divided by two if it does not equal 1, thereby determining a new BSV. If the BSV does equal 1, it will remain 1. Finally, in step 308, the binary search will be repeated from step 304 a total of N times.

Figure 4:
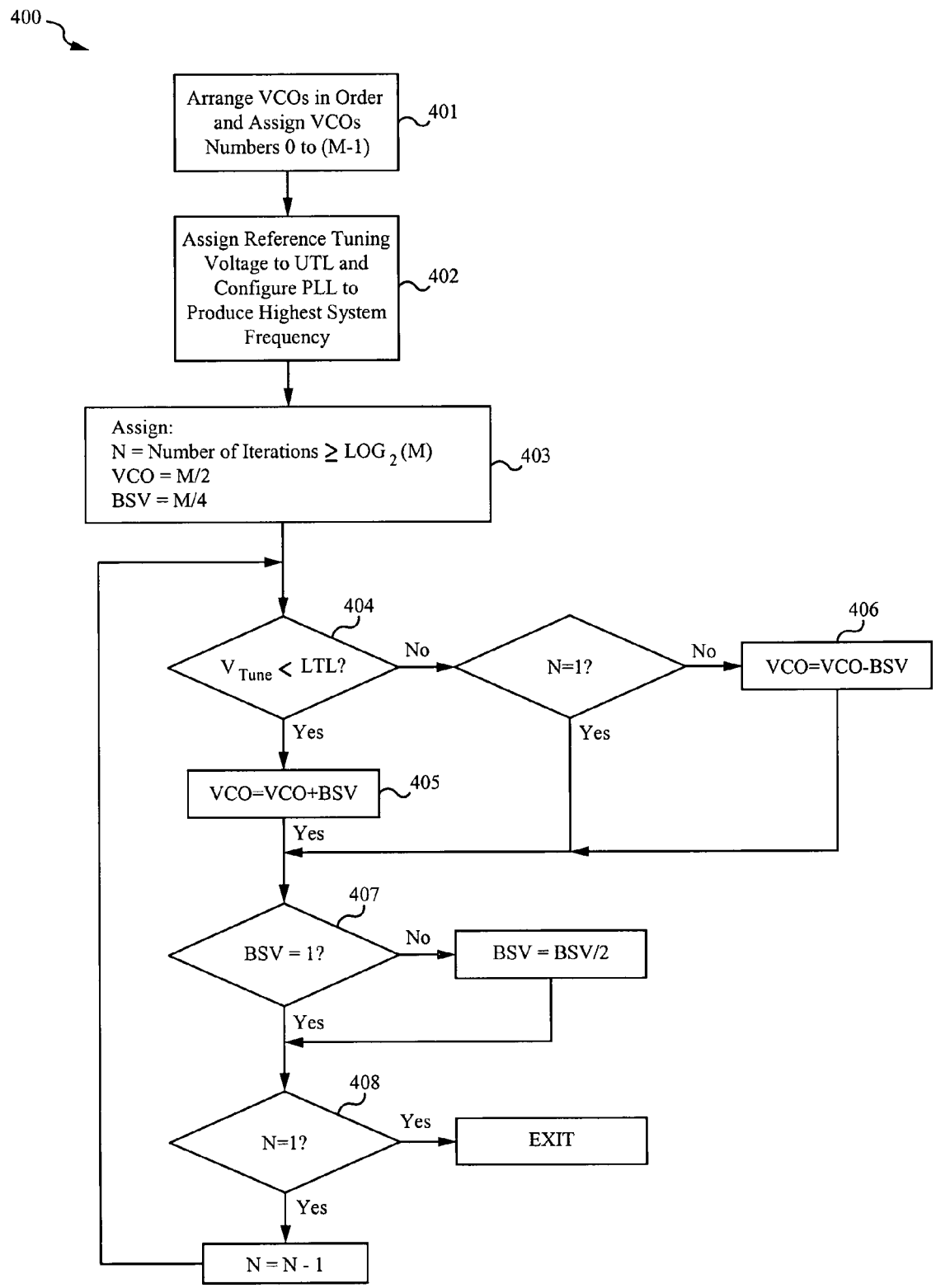
FIG. 4 shows a flow chart for a typical embodiment of the method and all functional steps for a VCO with negative VCO gain.

If a VCO with the characteristics described in FIG. 2B is used, the method in FIG. 3 changes accordingly as detailed in method 400 in FIG. 4. Again, each VCO has a range of output frequencies having an upper tuning frequency and a lower tuning frequency. The first step 401 of method 400 is to arrange the VCOs into an order by their upper tuning frequencies, ordered lowest to highest, such that the VCO with the highest frequency is highest in the order and there is a middle VCO. Next, in step 402, a reference tuning voltage 107 is set to LTL 209. The calibration frequency is the highest frequency to be encountered by the system. In the next step 403, a binary search is started by selecting the middle VCO, assigning a search variable (BSV) to M/4, and selecting the number of iterations N. The number of iterations is preferably a minimum of $LOG_2(M)$. Alternatively, the number of iteration is greater than $LOG_2(M)$. In some embodiments, the middle VCO is the VCO numbered M/2. In step 404, the tuning voltage 116 is compared to the reference tuning voltage 107 using VCO that has been selected. If the tuning voltage is less than the LTL, the process moves to step 405 and a next VCO is selected. Preferably, the next VCO selected is up in the order of VCOs by an increment equivalent to a binary search variable (BSV). Conversely, if the reference tuning voltage is not less than the LTL, and the iteration is not the final iteration, the next step is 406 and the next VCO selected is down in the order of VCOs by the binary search variable. If the iteration is the final iteration, then VCO is left unchanged because the VCO numbered VCO-BSV has been visited and known to result in a control voltage less than the LTL 209. In alternate embodiments, the VCOs could be ordered such that the VCO with the highest frequency range is lowest in the order in step 401. In such an embodiment, the functions of steps 405 and 406 are reversed. No matter the result of the comparison in step 404, a next location for the search window will be determined. Next, in the step 407, the search variable will be divided by two if it does not equal 1, thereby determining a new search variable. If the search variable does equal 1, it will remain 1 and the process will exit. Finally, in step 408, the binary search will be repeated from step 404 a total of N times.

Figure 5:
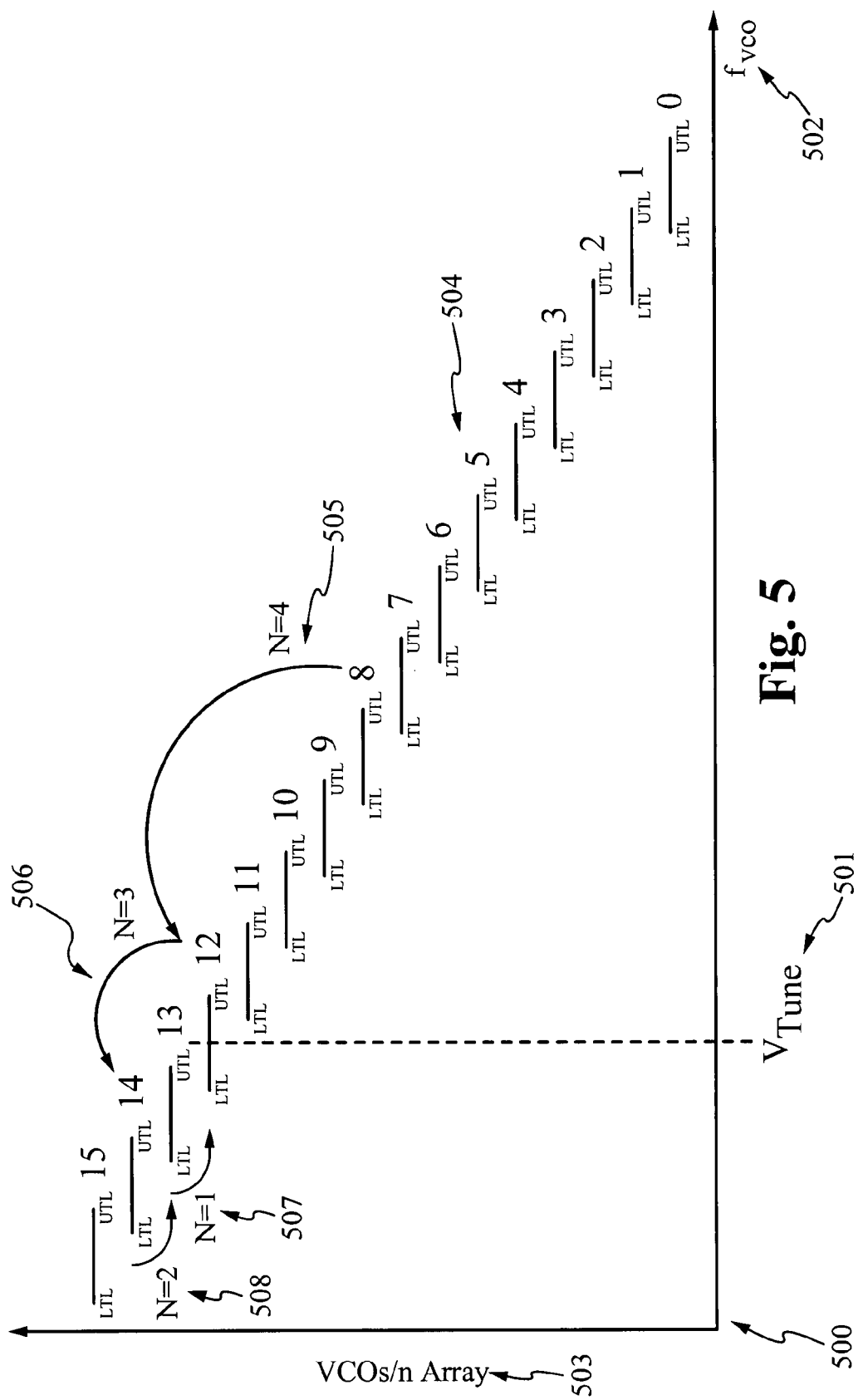
FIG. 5 is a graph representing an example of the function of the invention.

FIG. 5 shows a graph of an example of the method detailed in FIG. 3 is shown. The graph 500 is made up of the X axis 502, $f_{VCO}$, and a Y axis 503 VCOs in bank. In this example, there are 16 VCOs 504 in this array, numbered 0 to 15, such that VCO 0 has the highest frequency range and is lowest in the order. Each VCO has an upper tuning limit (UTL) and a lower tuning limit (LTL). Also, a calibration frequency 501 has been assigned, which is shown by the dashed line. For purposes of this example, the optimum VCO is the VCO numbered 12 because it locks with the largest reference tuning voltage between LTL and UTL. Since there are 16 VCOs 504 in this array, M equals 16. A binary search will start by placing a search window on the middle VCO in the order. The binary search will iterate at least N times, where N is $log_2(M)$, which equals 4. The middle VCO is most conveniently determined as the number M/2, or 8. In this example, the starting binary search variable (BSV) is M/4, which equals 4. Alternatively, any convenient way of starting the search at the middle VCO is useable. Said differently, a search set of VCOs is designated as all VCOs in the system. At least one VCO is selected from the search set to be the starting.

In the first iteration 505, the UTL of VCO 8 is compared to the reference tuning voltage 501. In this case, the PFD will cause the VCO control voltage to be less than the UTL. Since the reference tuning voltage is not greater than the UTL, the search window will move up in the order by the BSV to the VCO numbered 12. The BSV is not 1, so it is divided by 2. The BSV becomes 2. In operation, the comparison between the reference tuning voltage and the UTL divides the search set of VCOs into a searched portion and a non-searched portion. The searched portion is designated as a new search set of VCOs. In this example, the new search set comprises the VCOs 9-15. The VCOs 0-8 are considered searched and rejected.

In the second iteration 506, the UTL of the VCO numbered 12 is compared to the tuning voltage 112. Again the tuning voltage 112 is not greater than the UTL, the search window will move up in the order by the search variable to VCO 14. The BSV is not 1, so it is divided by 2. The BSV is now 1. Again, the comparison between the reference tuning voltage and the UTL divides the search set of VCOs into a searched portion and a non-searched portion. The searched portion is designated as a new search set of frequency generating elements. In this example, the new search set comprises the VCOs 12-15. The VCOs 0-11 are considered searched and rejected.

In the third iteration 507, the UTL of VCO 14 is compared to the tuning voltage. The tuning voltage is now greater than the UTL, and therefore search window will move down in the order by the search variable to VCO 13. The BSV is 1, so it remains 1. Again, the comparison between the tuning voltage and the UTL divides the search set of VCOs into a searched portion and a non-searched portion. The searched portion is designated as a new search set of frequency generating elements. In this example, the new search set comprises the VCOs 12-13. The VCOs 0-11 and 14-15 are considered searched and rejected.

In the fourth and final iteration 508, the UTL of VCO 13 is compared to the tuning voltage. The reference tuning voltage is still greater than the UTL, so the search window will move down in the order by the BSC to the VCO numbered 12. The optimum VCO has been chosen in $log_2(M)$ iterations. If one more iteration is desired, then the UTL of The VCO numbered 12 would again be compared to the reference tuning voltage. Because the reference tuning voltage is less than UTL, previous non terminating iterations would select VCO 13. But because this is the final iteration, the VCO bank is not allowed to increment and the calibration process correctly chooses the VCO numbered 12.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. For example, different logic circuit configurations could be substituted for the logic circuit described above to perform the functions of the embodiments illustrated.

We claim:

1. A method of selecting a frequency generating element from an array of M frequency generating elements, each element having an output frequency range, the range having an upper frequency limit and a lower frequency limit, wherein the upper frequency limit is higher than the lower frequency limit, corresponding to an input tuning voltage range having an upper tuning limit and a lower tuning limit comprising:
 a. arranging the frequency generating elements into an order by their output frequencies, such that there is a middle frequency generating element;
 b. determining a reference tuning voltage corresponding to a lowest practical gain of a frequency generating element;
 c. determining a reference frequency corresponding to a lowest practical gain of a frequency generating element;
 d. starting a binary search by selecting the middle frequency generating element and assigning a search variable, having an initial value of M/2;
 e. comparing the reference tuning voltage to the upper tuning limit of the frequency generating element that has been selected, thereby determining a next frequency generating element to be selected;
 f. dividing the search variable by two if the search variable does not equal one, thereby determining a new value for the search variable; and
 g. repeating the steps of comparing and dividing for a number of iterations.

2. The method in claim 1 wherein the frequency generating element is comprised of any among a list of: at least one VCO, a binary switchable resonator, a tunable resonator, a combination thereof, and the array of frequency generating elements is comprised of any among a list of: an array of VCOs, an array of binary switchable resonators, an array of tunable resonators, a combination thereof.

3. The method of claim 1, wherein the step of determining a next frequency generating element comprises selecting a frequency generating element down in the order, by an increment equivalent to the search variable if the reference tuning voltage is greater than the upper tuning limit of the selected frequency generating element, otherwise selecting a frequency generating element up in the order by the increment equivalent to the search variable in the event a next iteration is performed.

4. The method of claim 3, wherein all frequency generating elements have a positive gain, the reference frequency corresponds to a high extreme operating frequency and the frequency generating elements are ordered such that the element with the highest frequency range is lowest in the order.

5. The method of claim 3, wherein all frequency generating elements have a negative gain, the reference frequency corresponds to a low extreme operating frequency, and the frequency generating elements are ordered such that the element with the lowest frequency range is lowest in the order.

6. The method of claim 1, wherein the step of determining a next frequency generating element comprises selecting a frequency generating element up in the order, by an increment equivalent to the search variable if the reference tuning voltage is greater than the upper tuning limit of the selected frequency generating element, otherwise selecting a frequency generating element down in the order by the increment equivalent to the search variable in the event a next iteration is performed.

7. The method of claim 6, wherein all frequency generating elements have a positive gain, the reference frequency corresponds to a high extreme operating frequency and the frequency generating elements are ordered such that the element with the lowest frequency range is lowest in the order.

8. The method of claim 6, wherein all frequency generating elements have a negative gain, the reference frequency corresponds to a low extreme operating frequency and the frequency generating elements are ordered such that the element with the highest frequency range is lowest in the order.

9. A method of selecting an optimum frequency generating among an array of M frequency generating elements, each frequency generating element having a range of output frequencies having an upper tuning frequency and a lower tuning frequency, wherein the upper tuning frequency is higher than the lower tuning frequency, corresponding to an input tuning voltage range having an upper tuning limit and a lower tuning limit, the method comprising:
 a. arranging the frequency generating elements into an order by their output frequencies, such that there is a middle frequency generating element;
 b. determining a reference tuning voltage corresponding to a lowest practical gain of a frequency generating element;
 c. determining a reference frequency corresponding to a lowest practical gain of a frequency generating element;
 d. starting a binary search by selecting the middle frequency generating element and assigning a search variable, having an initial value of M/2;
 e. comparing the reference tuning voltage to the lower tuning limit of the frequency generating element that has been selected, thereby determining a next frequency generating element to be selected;
 f. dividing the search variable by two if the search variable does not equal one, thereby determining a new value for the search variable; and
 g. repeating the steps of comparing and dividing for a number of iterations.

10. The method in claim 9, wherein the frequency generating element is comprised of any among a list of: at least one VCO, a binary switchable resonator, a tunable resonator, a combination thereof, and the array of frequency generating elements is comprised of any among a list of: an array of VCOs, an array of binary switchable resonators, an array of tunable resonators, a combination thereof.

11. The method of claim 9, wherein the step of determining a next frequency generating element comprises selecting a frequency generating element down in the order, by an increment equivalent to the search variable if the reference tuning voltage is less than the lower tuning limit of the selected frequency generating element, otherwise selecting a frequency generating element up in the order by the increment equivalent to the search variable in the event a next iteration is performed.

12. The method of claim 11, wherein all frequency generating elements have a positive gain, the reference frequency corresponds to a low extreme operating frequency and the frequency generating elements are ordered such that the element with the lowest frequency range is lowest in the order.

13. The method of claim 11, wherein all frequency generating elements have a negative gain and the reference frequency corresponds to a high extreme operating frequency, and the frequency generating elements are ordered such that the element with the highest frequency range is lowest in the order.

14. The method of claim 9, wherein the step of determining a next frequency generating element comprises selecting a frequency generating element up in the order, by an increment equivalent to the search variable if the reference tuning voltage is greater than the lower tuning limit of the selected frequency generating element, otherwise selecting a frequency generating element down in the order by the increment equivalent to the search variable in the event a next iteration is performed.

15. The method of claim 14, wherein all frequency generating elements have a positive gain, the reference frequency corresponds to a low extreme operating frequency and the frequency generating elements are ordered such that the element with the highest frequency range is lowest in the order.

16. The method of claim 14, wherein all frequency generating elements have a negative gain, the reference frequency corresponds to a high extreme operating frequency and the frequency generating elements are ordered such that the element with the lowest frequency range is lowest in the order.

17. An electric circuit for selecting a frequency generating element from an array of M frequency generating elements, each element having an output frequency range, the range having an upper frequency limit and a lower frequency limit, wherein the upper frequency limit is higher than the lower frequency limit corresponding to an input tuning voltage range having an upper tuning limit and a lower tuning limit, comprising:
   a. means for arranging the frequency generating elements into an order by their output frequencies, such that there is a middle frequency generating element;
   b. means for determining a reference tuning voltage corresponding to a lowest practical gain of a frequency generating element;
   c. means for determining a reference frequency corresponding to a lowest practical gain of a frequency generating element;
   d. means for starting a binary search by selecting the middle frequency generating element and assigning a search variable, having an initial value of M/2;
   e. means for comparing the tuning voltage to the upper tuning limit of the frequency generating element that has been selected, thereby determining a next frequency generating element to be selected;
   f. means for dividing the search variable by two if the search variable does not equal one, thereby determining a new value for the search variable; and
   g. means for repeating the steps of comparing and dividing for a number of iterations.

18. The electric circuit in claim 17, wherein the frequency generating element is comprised of any among a list of: at least one VCO, a binary switchable resonator, a tunable resonator, a combination thereof, and the array of frequency generating elements is comprised of any among a list of: an array of VCOs, an array of binary switchable resonators, an array of tunable resonators, a combination thereof.

19. The electric circuit of claim 17, wherein the means for determining a next frequency generating element comprises a means for selecting a frequency generating element down in the order, by an increment equivalent to the search variable if the reference tuning voltage is greater than the upper tuning limit of the selected frequency generating element, otherwise selecting a frequency generating element up in the order by the increment equivalent to the search variable in the event a next iteration is performed.

20. The electric circuit of claim 19, wherein all frequency generating elements have a positive gain, the reference frequency corresponds to a high extreme operating frequency and the frequency generating elements are ordered such that the element with the highest frequency is lowest in the order.

21. The electric circuit of claim 19, wherein all frequency generating elements have a negative gain, the reference frequency corresponds to a low extreme operating frequency and the frequency generating elements are ordered such that the element with the lowest frequency is lowest in the order.

22. The electric circuit of claim 17, wherein the means for determining a next frequency generating element comprises means for selecting a frequency generating element up in the order, by an increment equivalent to the search variable if the reference tuning voltage is greater than the upper tuning limit of the selected frequency generating element, otherwise selecting a frequency generating element down in the order by the increment equivalent to the search variable in the event a next iteration is performed.

23. The electric circuit of claim 22, wherein all frequency generating elements have a positive gain, the reference frequency corresponds to a high extreme operating frequency and the frequency generating elements are ordered such that the element with the lowest frequency is lowest in the order.

24. The electric circuit of claim 22, wherein all frequency generating elements have a negative gain, the reference frequency corresponds to a low extreme operating frequency and the frequency generating elements are ordered such that the element with the highest frequency is lowest in the order.

25. An electric circuit for selecting an optimum frequency generating among an array of M frequency generating elements, each element having an output frequency range, the range having an upper frequency limit and a lower frequency limit, wherein the upper frequency limit is higher than the lower frequency limit corresponding to an input tuning voltage range having an upper tuning limit and a lower tuning limit, comprising:
   a. means for arranging the frequency generating elements into an order by their output frequencies, such that there is a middle frequency generating element;
   b. means for determining a reference tuning voltage corresponding to a lowest practical gain of a frequency generating element;
   c. means for determining a reference frequency corresponding to a lowest practical gain of a frequency generating element;
   d. means for starting a binary search by selecting the middle frequency generating element and assigning a search variable, having an initial value of M/2;
   e. means for comparing the tuning voltage to the lower tuning limit of the frequency generating element that has been selected, thereby determining a next frequency generating element to be selected;
   f. means for dividing the search variable by two if the search variable does not equal one, thereby determining a new value for the search variable; and
   g. means for repeating the steps of comparing and dividing for a number of iterations.

26. The electric circuit in claim 25, wherein the frequency generating element is comprised of any among a list of: at least one VCO, a binary switchable resonator, a tunable resonator, a combination thereof, and the array of frequency generating elements is comprised of any among a list of: an array of VCOs, an array of binary switchable resonators, an array of tunable resonators, a combination thereof.

27. The electric circuit of claim 25, wherein the means for determining a next frequency generating element comprises means for selecting a frequency generating element down in the order, by an increment equivalent to the search variable if the reference tuning voltage is less than the lower tuning limit of the selected frequency generating element, otherwise selecting a frequency generating element up in the order by the increment equivalent to the search variable, in the event a next iteration is performed.

28. The electric circuit of claim 27, wherein all frequency generating elements have a positive gain, the reference frequency corresponds to a low extreme operating frequency and the frequency generating elements are ordered such that the frequency generating element with the lowest frequency is lowest in the order.

29. The electric circuit of claim 27, wherein all frequency generating elements have a negative gain, the reference frequency corresponds to a high extreme operating frequency and the frequency generating elements are ordered such that the frequency generating element with the highest frequency is lowest in the order.

30. The electric circuit of claim 25, wherein the means for determining a next frequency generating element comprises means for selecting a frequency generating element up in the order, by an increment equivalent to the search variable if the reference tuning voltage is less than the lower tuning limit of the selected frequency generating element, otherwise selecting a frequency generating element down in the order by the increment equivalent to the search variable, in the event a next iteration is performed.

31. The electric circuit of claim 30, wherein all frequency generating elements have a positive gain the reference frequency corresponds to a low extreme operating frequency and the frequency generating elements are ordered such that the frequency generating element with the highest frequency is lowest in the order.

32. The electric circuit of claim 30, wherein all frequency generating elements have a negative gain the reference frequency corresponds to a high extreme operating frequency and the frequency generating elements are ordered such that the frequency generating element with the lowest frequency is lowest in the order.

* * * * *